(12) United States Patent
Peng

(10) Patent No.: US 8,054,649 B2
(45) Date of Patent: Nov. 8, 2011

(54) ADJUSTABLE HOUSING FRAME WITH INDUSTRIAL RAILS FOR ADJUSTING THE DEPTH OF COMMUNICATION APPARATUS WITHIN A HOUSING CABINET

(75) Inventor: Te-Chun Peng, Sijhih (TW)

(73) Assignee: Etherwan Systems, Inc., Sindian, Taipei County (TW)

( * ) Notice: Subject to any disclaimer, the term of this patent is extended or adjusted under 35 U.S.C. 154(b) by 267 days.

(21) Appl. No.: 12/571,664

(22) Filed: Oct. 1, 2009

(65) Prior Publication Data

US 2011/0080079 A1    Apr. 7, 2011

(51) Int. Cl.
*H02B 1/01* (2006.01)
*H01R 13/73* (2006.01)

(52) U.S. Cl. .................... 361/825; 248/68.1; 248/298.1; 439/532

(58) Field of Classification Search .................... 211/26, 211/26.2, 190, 192, 183, 162, 175, 187; 312/223.1, 312/223.3, 265.1–265.4, 334.4, 334.5, 334.7; 361/688, 689, 690, 694, 695, 825, 826; 248/27.1, 248/298.1, 65, 68.1; 174/72 A, 95, 97, 101, 174/68.1, 68.3, 99 R; 439/532, 716, 718, 439/527
See application file for complete search history.

(56) References Cited

U.S. PATENT DOCUMENTS

| | | | |
|---|---|---|---|
| 261,316 A * | 7/1882 | Davies | 104/110 |
| 2,428,288 A * | 9/1947 | Miles et al. | 242/157 R |
| 3,025,122 A * | 3/1962 | Millman | 312/245 |
| 3,120,069 A * | 2/1964 | Pfaff, Jr et al. | 40/624 |
| 3,133,768 A * | 5/1964 | Klakovich | 384/17 |
| 4,321,654 A * | 3/1982 | Nakajo et al. | 361/744 |
| 5,626,406 A * | 5/1997 | Schmid | 312/334.28 |
| 5,823,647 A * | 10/1998 | Miyoshi | 312/333 |
| 6,360,900 B1 * | 3/2002 | Carbonneau et al. | 211/26 |
| 6,554,231 B2 * | 4/2003 | Choi | 248/65 |
| 6,739,682 B2 * | 5/2004 | Shih | 312/334.4 |
| 6,811,130 B1 * | 11/2004 | Oh | 248/343 |
| 6,893,091 B1 * | 5/2005 | Fenner | 312/334.8 |
| 7,218,526 B2 * | 5/2007 | Mayer | 361/725 |
| 7,594,628 B2 * | 9/2009 | Yang et al. | 248/58 |
| 2002/0074915 A1 * | 6/2002 | Shih | 312/334.5 |
| 2003/0019824 A1 * | 1/2003 | Gray | 211/26 |
| 2003/0042215 A1 * | 3/2003 | Tomino | 211/26 |
| 2007/0200039 A1 * | 8/2007 | Petak | 248/219.1 |
| 2010/0085704 A1 * | 4/2010 | Liu | 361/679.58 |

* cited by examiner

*Primary Examiner* — Michael Safavi
*Assistant Examiner* — Sasha T Varghese
(74) *Attorney, Agent, or Firm* — Muncy, Geissler, Olds & Lowe, PLLC

(57) ABSTRACT

An adjustable housing frame with industrial rails includes a fixed plate, two movable plates and at least two positioning pieces. A front side of the fixed plate is provided with a rail. Both ends of the fixed plate are provided with two opposite rails respectively. Each set if the two opposite rails is provided with at least one positioning hole. One of the two movable plates is provided in the two rails at one end of the fixed plate, and the other movable plate is provided in the two rails at the other end of the fixed plate. Edges of the two movable plates are provided with a plurality of positioning troughs. The two positioning pieces pass through the two positioning holes and extend into the positioning troughs respectively. The two positioning pieces are stopped on inner walls of the positioning trough.

7 Claims, 6 Drawing Sheets

ADJUSTABLE HOUSING FRAME WITH INDUSTRIAL RAILS FOR ADJUSTING THE DEPTH OF COMMUNICATION APPARATUS WITHIN A HOUSING CABINET

BACKGROUND OF THE INVENTION

1. Field of the Invention

The present invention relates to an adjustable housing frame with industrial rails, and in particular to an adjustable housing frame with industrial rails for hanging a communication apparatus thereon.

2. Description of Related Art

Nowadays, network servers have been used more and more widely. For an internal network system of an industry or an ISP manufacturer, it is an important issue to manage and arrange a plurality of computer hosts or communication apparatuses. To this end, the manufacturers in this field have provided various housing frames for different instruments. It should be noted that the width of the computer host or communication apparatus is of a certain international standard. No matter how the housing frame is designed, the international standard has to be conformed to. However, there is no requirement about the depth of the computer host or communication apparatus. As a result, the computer hosts or communication apparatuses made by various manufacturers are different from each other in depth.

Please refer to FIG. 1. A conventional housing frame 1a with industrial rails is provided in a housing cabinet 2a. The housing frame 1a with industrial rails includes a body 10a, a rail 11a and two fixing portions 12a. The body 10a is bent into an inverted "U" shape. The rail 11a is elongate and protrudes from the body 1a for hanging a communication apparatus 3a thereon. The communication apparatus 3a is provided with a connecting port (not shown). The connecting port is inserted by a plug 4a for signal transmission. The two fixing portions 12a are bent and extend toward two ends of the body 1a. The two fixing portions 12a are fixed to the housing cabinet 2a.

However, the communication apparatuses 3a made by various manufacturers are different from each other in depth. For example, a larger communication apparatus 3a has a smaller depth H, so that the plug 4a and a line 41a connected to the plug 4a are exposed beyond the housing cabinet 2a. Thus, the plug 4a may be hit easily or the line 41a may be pulled to deteriorate its electrical contact. The smaller communication apparatus 3a has a larger depth h, so that the user has to stretch out his/her hand into the housing cabinet 2a in order to insert the plug 4a to the communication apparatus 3a which makes the insertion difficult.

In order to overcome the above problems, the present Inventor proposes a novel and reasonable structure based on his delicate researches and expert experiences.

SUMMARY OF THE INVENTION

The objective of the present invention is to provide an adjustable housing frame with industrial rails, which is configured to allow a user to adjust the depth of a communication apparatus. With this arrangement, the plug and the line connected to the communication apparatus can be accommodated and protected in the housing cabinet. Further, the plug and the line can be inserted into the communication apparatus easily.

The present invention provides an adjustable housing frame with industrial rails, which includes: a fixed plate provided with a rail on its front side, both ends of the fixed plate being provided with two opposite rails respectively, the two opposite rails being provided with at least one positioning hole; two movable plates, one of the two movable plates being provided in the two rails at one end of the fixed plate, the other movable plate being provided in the two rails at the other end of the fixed plate, edges of the two movable plates being provided with a plurality of positioning troughs; and at least two positioning pieces passing through the two positioning holes and extending into the positioning troughs respectively, the two positioning pieces being stopped on inner walls of the positioning trough.

The present invention has advantageous features as follows. The two ends of the fixed plate of the present invention are provided with two opposite rails respectively. One of the movable plates is provided in the two rails at one end of the fixed plate, and the other movable plate is provided in the two rails at the other end of the fixed plate. The rail is provided with positioning holes. The upper and lower edges of the two movable plates are provided with positioning troughs. The positioning piece passes through the positioning hole and extends into the positioning trough. The positioning piece is stopped on the inner wall of the positioning trough. With this arrangement, when the positioning piece is removed from the inner wall of the positioning trough, the position of the fixed plate with respect to the two movable plates can be moved and adjusted. In this way, the communication apparatus has a suitable depth for accommodating the plug and the line inserted into the communication apparatus without protruding beyond the housing cabinet. Thus, the plug may not be hit and the line may not be pulled to deteriorate its electrical contact. Further, the user can insert the plug and the line into the accommodation apparatus more easily.

In order to further understand the characteristics and technical contents of the present invention, a description relating thereto will be made with reference to the accompanying drawings. However, the drawings are illustrative only but not used to limit the present invention.

DETAILED DESCRIPTION OF THE PREFERRED EMBODIMENTS

Figure 1:
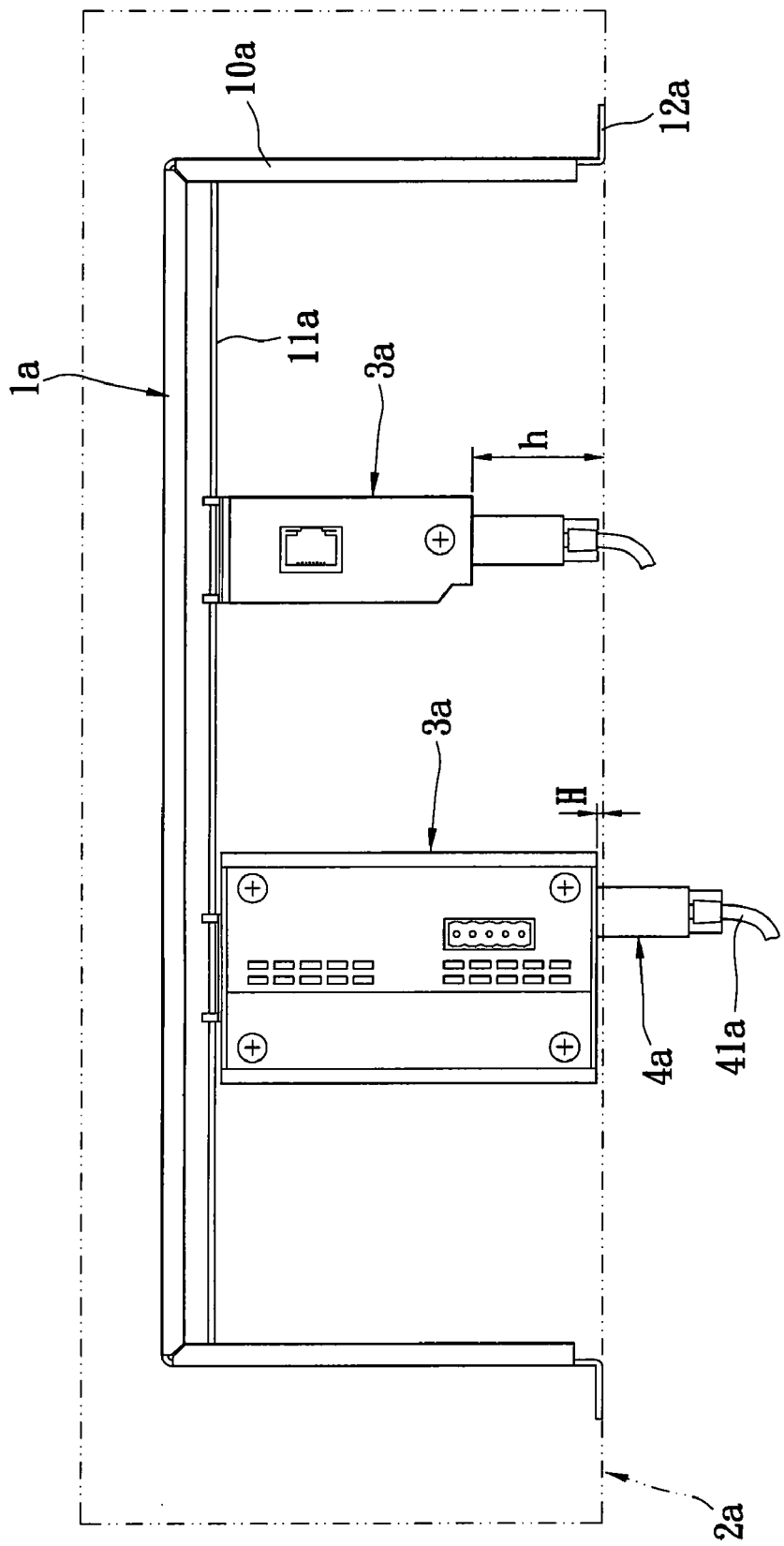
FIG. 1 is a schematic view showing a conventional housing frame with industrial rails.
Figure 2:
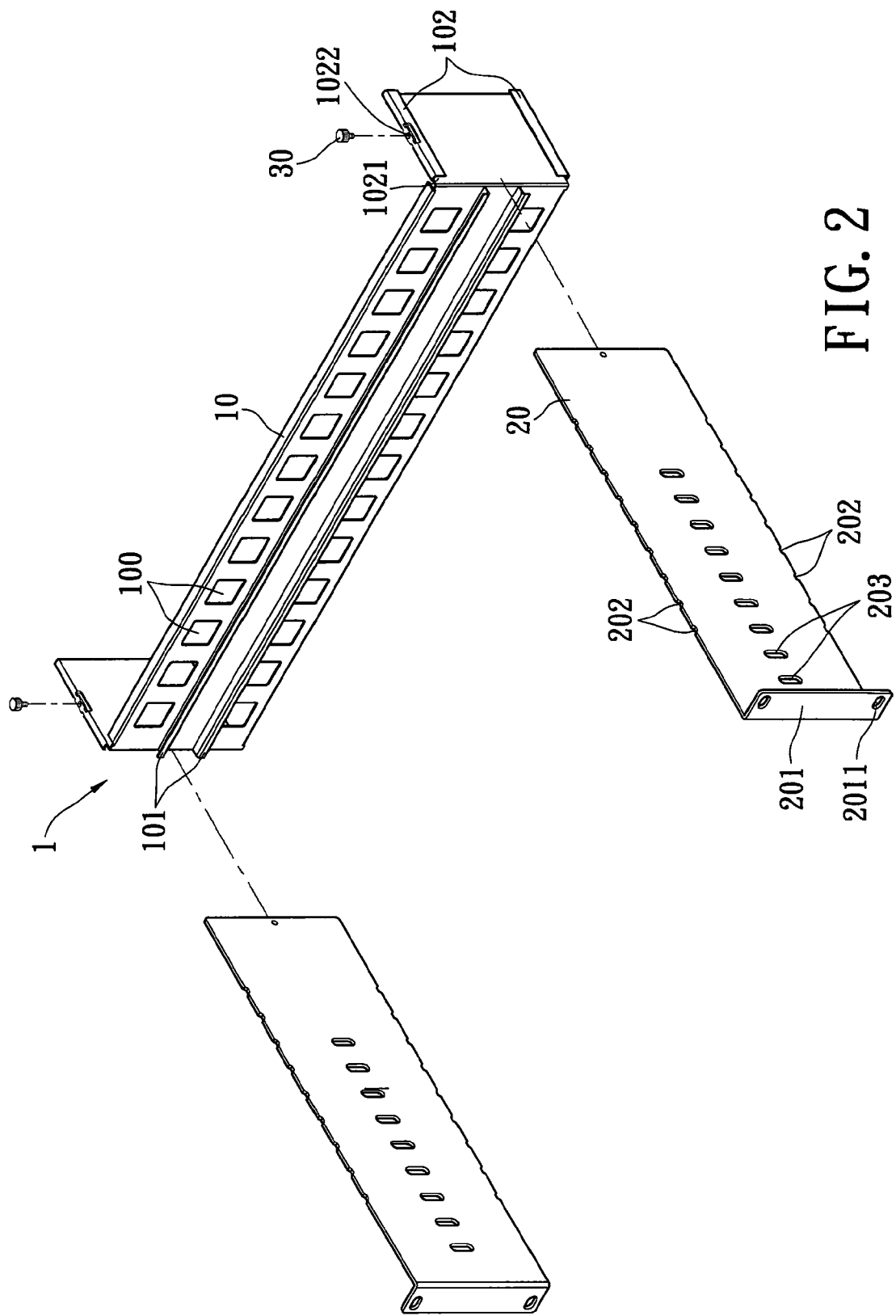
FIG. 2 is an exploded perspective view showing the adjustable housing frame with industrial rails of the present invention.
Figure 3:
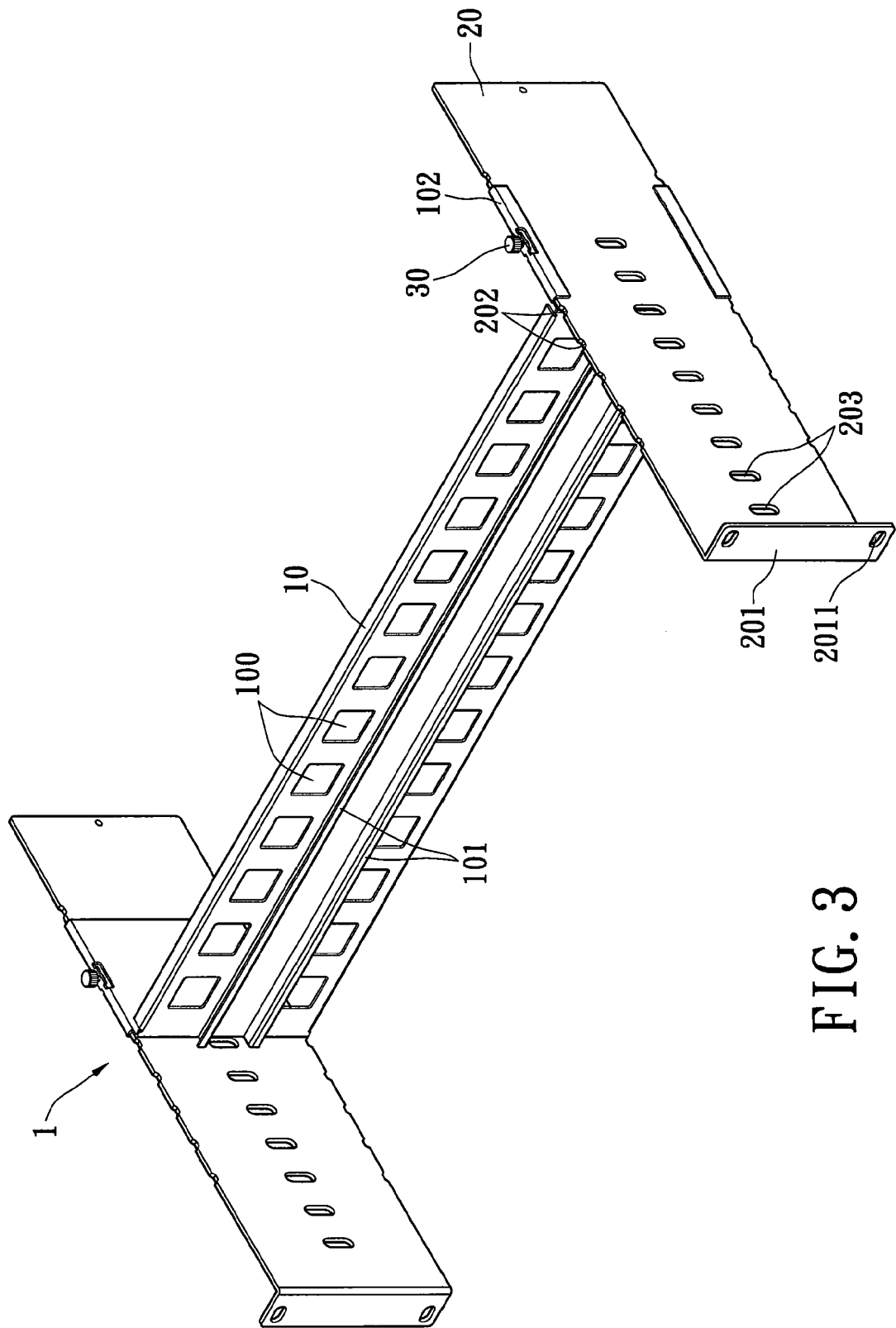
FIG. 3 is a perspective view showing the adjustable housing frame with industrial rails of the present invention.
Figure 4:
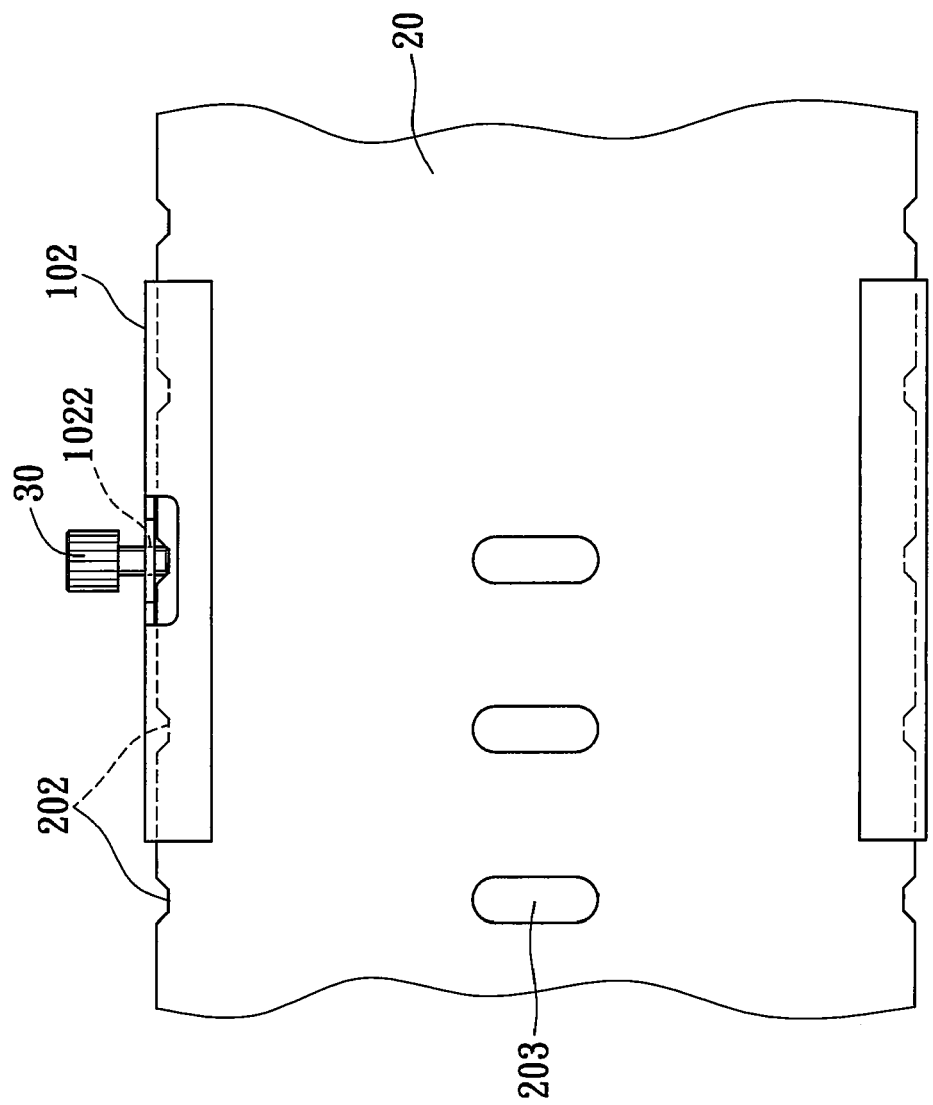
FIG. 4 is a partially enlarged side view showing the adjustable housing frame with industrial rails of the present invention.

Please refer to FIGS. 2 to 4. The present invention provides an adjustable housing frame with industrial rails 1, which includes a fixed plate 10, two movable plates 20 and at least two positioning pieces 30.

The fixed plate 10 is made of metallic materials with both its ends bent, so that it is formed into an inverted "U" shape. The front side of the fixed plate 10 is provided with a plurality of openings 100 and a rail 101. The openings 100 are arranged on the upper and lower sides of the rail 101 at intervals for ventilation. In the present embodiment, the rail 101 has two metallic elongate strips bent in opposite directions. Both ends of the fixed plate 10 are provided with two opposite rails 102 respectively. The two rails 102 extend from the upper and lower edges of one end of the fixed plate 10 and are bent toward each other. The two rails 102 form two opposite grooves 1021 (FIG. 2). In the present embodiment, the rail 102 located on the upper edge of the two ends of the fixed plate 10 is provided with a though positioning hole 1022 respectively. The two positioning holes 1022 are screw holes.

The two movable plates 20 are made of metallic materials each with one end bent to form a fixing portion 201. In the present embodiment, the fixing portion 201 is provided with two fixing holes 2011. The upper and lower edges of the two movable plates 20 are provided with a plurality of positioning troughs 202 at intervals. The movable plate 20 is provided with a plurality of through-holes 203 arranged at intervals for ventilation. One of the movable plates 20 is slidingly disposed in the two opposite grooves 1021 at one end of the fixed plate 10, while the other movable plate 20 is slidingly disposed in the two opposite grooves 1021 at the other end of the fixed plate 10.

In the present embodiment, there are two positioning pieces 30. The two positioning pieces 30 are screws disposed in the two positioning holes 1022. A portion of the positioning piece 30 extends into the positioning trough 202 and is stopped on the inner wall of the positioning trough 202, thereby positioning the fixed plate 10 with respect to the two movable plates 20.

Figure 5:
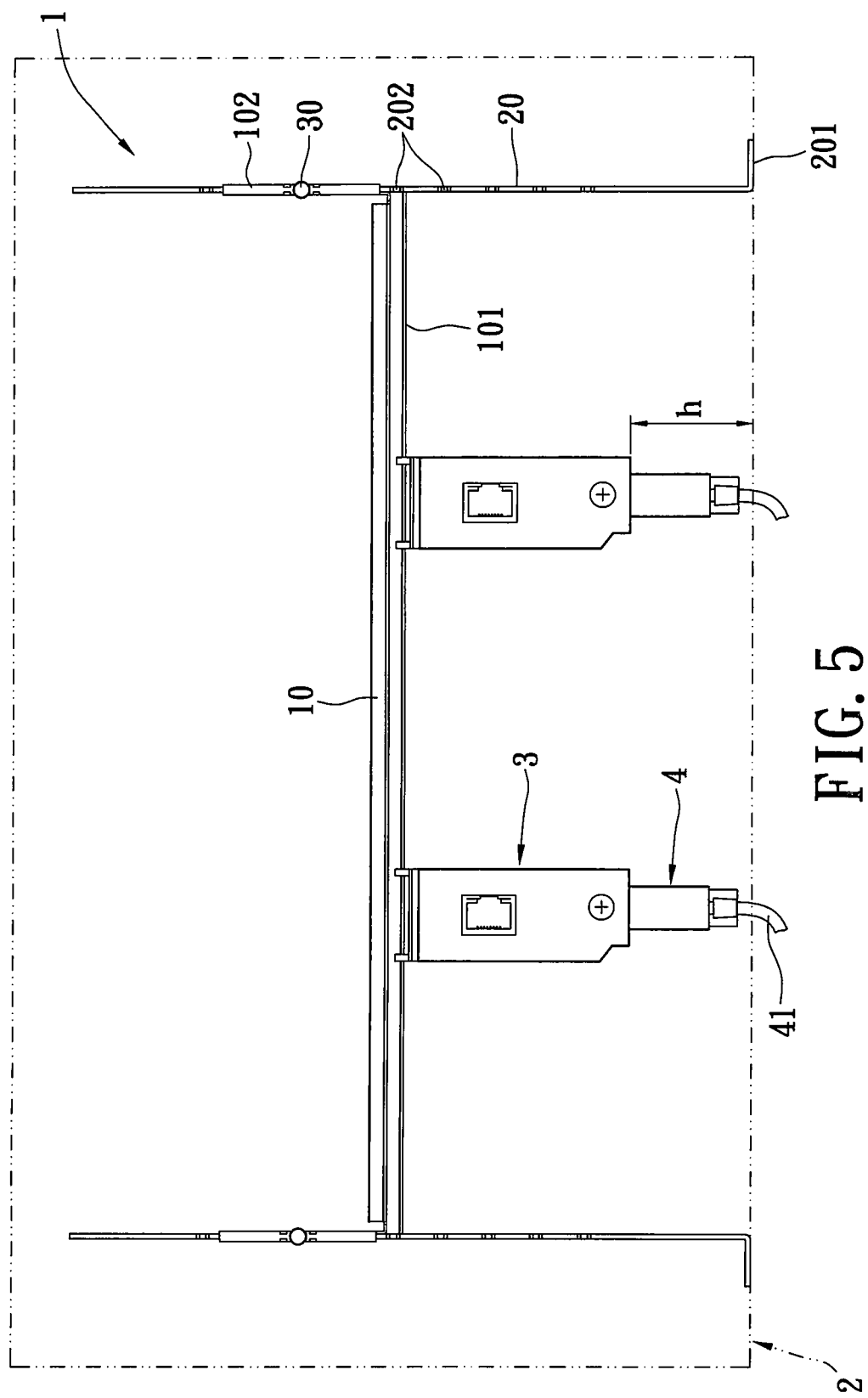
FIG. 5 is a schematic view showing the operating state of the adjustable housing frame with industrial rails of the present invention.
Figure 6:
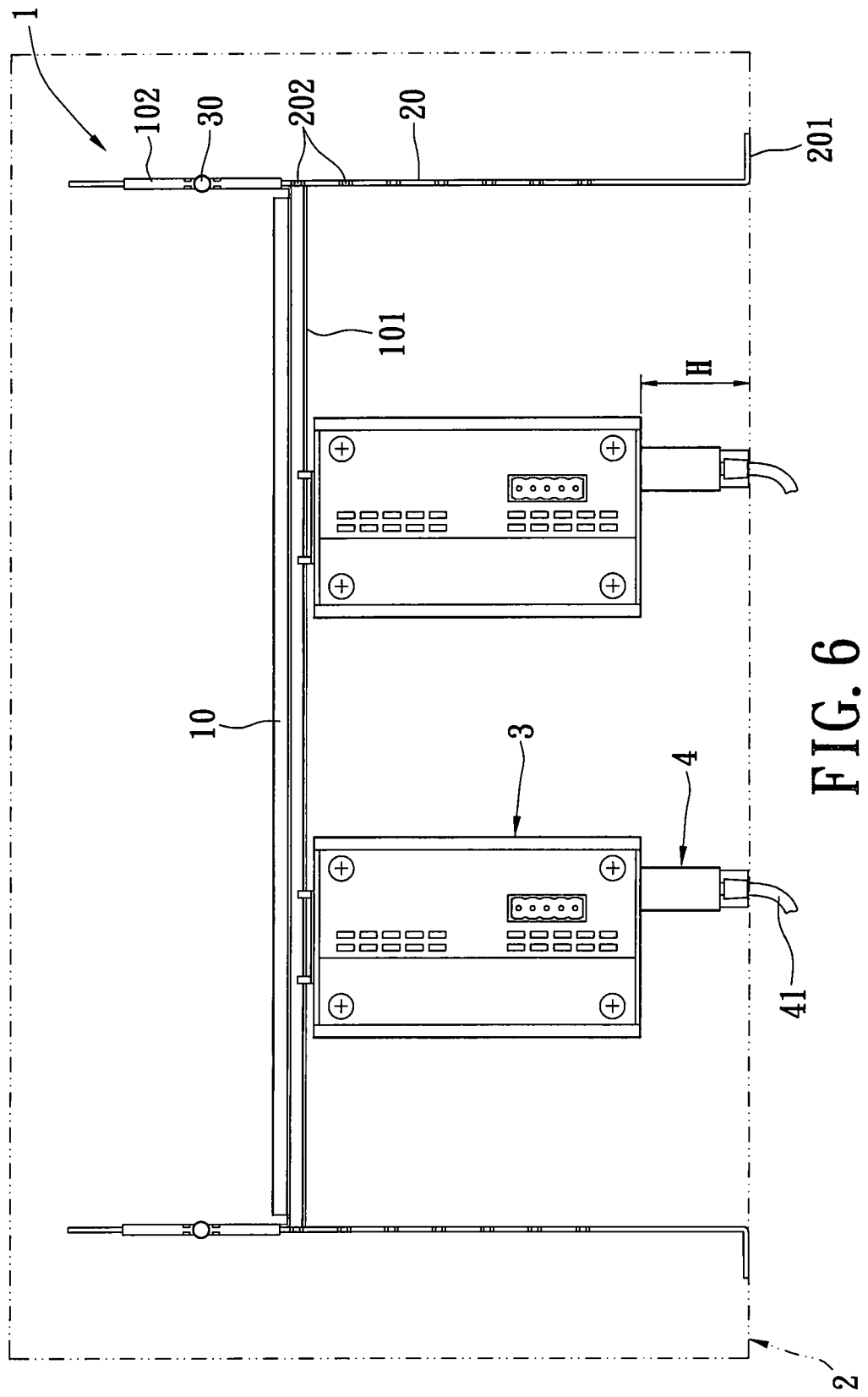
FIG. 6 is a schematic view showing another operating state of the adjustable housing frame with industrial rails of the present invention.

Please refer to FIGS. 5 and 6. The fixing portion 201 of the industrial rail housing frame 1 is fixed to an inner wall of a housing cabinet 2, so that the industrial rail housing frame 1 can be located in the housing cabinet 2. When the user intends to hang a small-sized communication apparatus 3 (FIG. 5) on the rail 101, the user only needs to rotate the positioning piece 30 to remove the positioning piece 30 from the inner wall of the positioning trough 202. In this way, the position of the fixed plate 10 with respect to the two movable plates 20 can be moved and adjusted, so that the communication apparatus 3 has a suitable depth h for accommodating a plug 4 and a line 41 inserted into the communication apparatus 3 without protruding beyond the housing cabinet 2. Similarly, when the user intends to hang a large-sized communication apparatus 3 (FIG. 6) on the rail 101, the user can adjust the position of the fixed plate 10 with respect to the movable plates 20, so that the communication apparatus 3 to have a suitable depth H according to the above steps, thereby accommodating the plug 4 and the line 41 inserted into the communication apparatus 3.

The two ends of the fixed plate 10 of the present invention are provided with two opposite rails 102 respectively. One of the movable plates 20 is slidingly disposed in the two opposite grooves 1021 at one end of the fixed plate 10, while the other movable plate 20 is slidingly disposed in the two opposite grooves 1021 at the other end of the fixed plate 10. The rail 102 is provided with positioning holes 1022. The upper and lower edges of the two movable plates 20 are provided with positioning troughs 202 respectively. The positioning piece 30 passes through the positioning holes 1022 and extends into the positioning trough 202. The positioning piece 30 is stopped on the inner wall of the positioning trough 202. In this way, the position of the fixed plate 10 and the two movable plates 20 can be moved and adjusted, so that the communication apparatus 3 can have a suitable depth (H/h) for accommodating the plug 4 and the line 41 inserted into the communication apparatus 3 without protruding beyond the housing cabinet 2. The plug 4 may not be hit and the line 41 may not be pulled to deteriorate its electrical contact. Thus, the user can insert the plug 4 and the line 41 into the communication apparatus 3 more easily.

The above-mentioned descriptions represent merely the preferred embodiments of the present invention, without any intention to limit the scope of the present invention thereto. Various equivalent changes, alternations or modifications based on the claims of present invention are all consequently viewed as being embraced by the scope of the present invention.

What is claimed is:

1. An adjustable housing frame with industrial rails, comprising:
   a fixed plate provided with a rail on its front side, both ends of the fixed plate being provided with two opposite rails respectively, each set of the two opposite rails being provided with at least one positioning hole;
   two movable plates, one of the two movable plates being provided in the two rails at one end of the fixed plate, the other movable plate being provided in the two rails at the other end of the fixed plate, edges of the two movable plates being provided with a plurality of positioning troughs; and
   at least one positioning piece passing through the at least one positioning hole in each rail and extending into the positioning troughs respectively, the two positioning pieces being stopped on inner walls of the positioning troughs.

2. The adjustable housing frame with industrial rails according to claim 1, wherein the fixed plate is formed into an inverted U shape, and the fixed plate is provided with a plurality of openings on two opposite sides of the rail.

3. The adjustable housing frame with industrial rails according to claim 1, wherein the rail has two elongate metallic strips bent in opposite directions.

4. The adjustable housing frame with industrial rails according to claim 1, wherein the two opposite rails extend from upper and lower edges of each end of the fixed plate and are bent towards each other, the two rails are formed with two opposite grooves, and the movable plates are disposed in the two opposite grooves on each end of the fixed plate, respectively.

5. The adjustable housing frame with industrial rails according to claim 1, wherein the positioning holes are screw holes, and the positioning pieces are screws.

6. The adjustable housing frame with industrial rails according to claim 1, wherein one end of each of the two movable plates is bent to form a fixing portion, and the fixing portion is provided with at least one fixing hole.

7. The adjustable housing frame with industrial rails according to claim 1, wherein the two movable plates are provided with a plurality of through-holes at intervals.

* * * * *